United States Patent [19]

Chao

[11] 4,453,235

[45] Jun. 5, 1984

[54] INTEGRATED MEMORY CIRCUITS

[75] Inventor: Robert L. Chao, Sunnyvale, Calif.

[73] Assignee: Supertex, Inc., Sunnyvale, Calif.

[21] Appl. No.: 429,995

[22] Filed: Sep. 30, 1982

Related U.S. Application Data

[63] Continuation of Ser. No. 153,316, May 27, 1980, abandoned.

[51] Int. Cl.³ .......................... G11C 7/00; G11C 8/00
[52] U.S. Cl. .................................... 365/189; 365/203; 365/210
[58] Field of Search ............... 365/104, 181, 203, 210, 365/189

[56] References Cited

U.S. PATENT DOCUMENTS 4,037,217  7/1977  Savarese .............................. 365/104
4,094,008  6/1978  Lockwood et al. ................. 365/210

OTHER PUBLICATIONS

Balasubramanian et al., "Two Device Per Bit, Precharged ROS with Differential Sensing," IBM Tech. Disc. Bul., vol. 19, No. 1, 6/76, pp. 164–165.

Primary Examiner—Stuart N. Hecker

[57] ABSTRACT

This is an improved approach to the operation of an integrated circuit memory, especially of the MOS type. The approach is especially suitable for use with CMOS read-only memories (ROMs). Specific improvements include address-triggered pulse generation, power switching and sharing for individual cells, a pseudo-dynamic approach to achieve quasi-static operation, self-compensating means for both "word" lines and "bit" lines, use of complementary decoding devices for the mutually orthogonal directions in the memory, and an improved output function. Specific circuitry for implementing the above approaches in a CMOS integrated circuit includes an address-triggered pulse generator, a self-tracking reference voltage source derived from both the "word" lines and the "bit" lines, an output stage with a CMOS driver into a bipolar transistor, and a sense amplifier including a capacitor.

1 Claim, 4 Drawing Figures

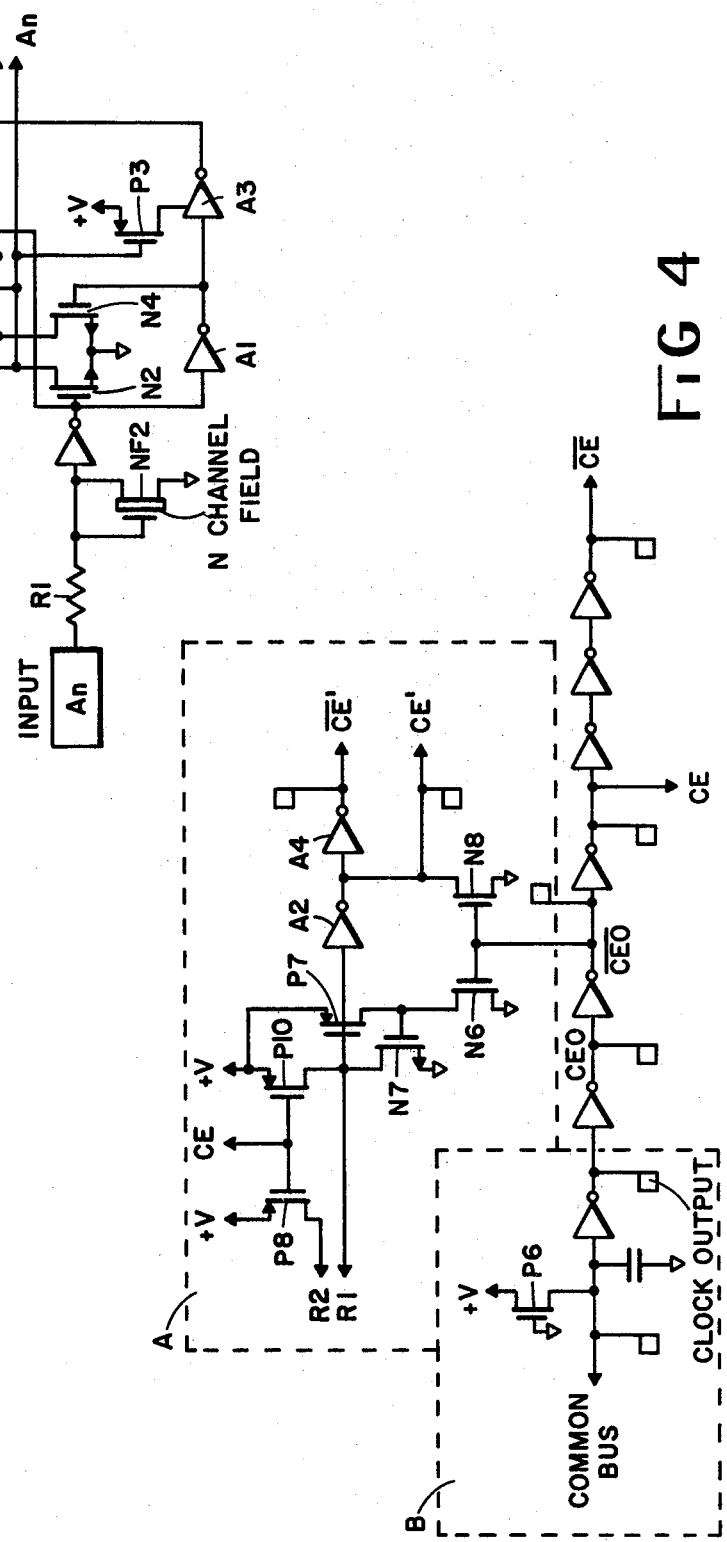

INTEGRATED MEMORY CIRCUITS

REFERENCE TO RELATED APPLICATION

This application is a continuation of application Ser. No. 153,316, filed May 27, 1980, now abandoned.

This application is closely related to the copending application of Robert Chao, and assigned to Supertex, Inc., entitled "Improved MOS Device with Ion-Implanted Channel-Stop Region and Fabrication Method Therefor".

BACKGROUND OF THE INVENTION

1. Field of the Invention

This invention relates generally to integrated circuit memory devices and methods of operation therefor and, more specifically, the invention relates to CMOS read-only memories.

2. Description of the Prior Art

In the past, read-only memories (ROM's) have been implemented in a variety of integrated circuit technologies. With the advent of large scale integrated (LSI) circuits in the MOS format, most prior art ROM's have utilized the N-channel conductivity type devices as opposed to P-channel conductivity type devices because of the increased speed performance possible with the former.

There remains an unfulfilled need for integrated circuit ROM's of lower power consumption. On a theoretical basis, at least, this need may be filled by complementary MOS device ROM's. However, the N-channel device configurations used heretofor in MOS LSI circuits are not particularly suited for the achievement of high density in the row-column array organization of a typical memory.

The companion application hereinbefore cited described improved complementary MOS devices for achieving an integrated circuit memory which operates at least internally with very low currents so that small device sizes may be achieved. In particular, the companion application described devices which have very high packing density for the achievement of memory devices with a high capacity.

This application describes methods for operating a memory device which take full advantage of the performance improvements provided by the devices described in the companion application. In accordance with the methods and the particular circuits described, the achievement of the full capability of the improved devices in a CMOS ROM having low power dissipation is enabled.

SUMMARY OF THE INVENTION

It is an object of the present invention to provide a method for operating an integrated circuit memory which decreases its overall power dissipation.

It is a further object of the present invention to provide a method for operation of an MOS memory which exploits densely-packed devices in a large array in order to minimize unwanted signals and provide uniform outputs from all cells of the array.

It is yet another object of the present invention to provide a method for operating an integrated circuit memory including internally address-triggered clock pulse generation.

It is still yet another object of the present invention to provide a pseudo-dynamic approach to achieve quasi-static operation. Means for providing such operation include: a single channel transistor in the memory matrix cell, means of precharging the common drains on the bit or row lines of the memory, means for selective discharge of the word or column lines, and means for simultaneous pull-up of complementary devices.

It is still a further object of the present invention to provide an improved method for buffering the output of the memory.

It is a yet still further object of the present invention to provide complementary decoding devices in the mutually orthogonal directions of the memory matrix respectively in order to reduce the static power dissipation.

It is yet a further object of the present invention to provide a method of sensing the contents of the memory by providing a capacitor in the sense amplifier to allow detection of very small signals.

It is still yet a further object of the present invention to provide improved circuitry for implementing the above-described methods in the CMOS integrated circuit format.

In order to achieve these as well as other objects, devices of a first polarity are used to implement the matrix of the memory. These devices have shared bit lines; every other line is precharged to the positive supply voltage and the remaining lines are discharged to the low potential of the supply voltage. In order to balance the output signals from a dense array comprising a large number of bits, reference bits are provided at one extremity of the array and are used to provide a reference signal which determines the output voltage from the self-tracking reference supply and which is self compensating for both word and bit lines. Each address buffer circuit generates a pulse which is applied to a common bus line in order to activate the clock generator which provides a clock pulse for internally activating all the other circuits.

The memory is sensed by a sense amplifier comprising two pair of complementary devices which are capacitively cross-coupled to allow detection of very small signals by the balanced amplifier; the sensing is clocked with three or more clocks to further reduce the possibility of false detection.

The above embodiments of the instant invention are more fully described in the following detailed description and drawings associated therewith.

BRIEF DESCRIPTION OF THE DRAWINGS

FIG. 2 is an alternate rendition of the output circuit "D" of FIG. 1 showing one way of implementing the desired output function.

FIG. 3 shows one of the input address buffer circuits and the associated circuitry for generating a pulse onto the common bus for activating the clock generator.

FIG. 4 shows the circuitry of the self-compensating reference source in portion "A" and the clock generator in portion "B".

DESCRIPTION OF THE PREFERRED EMBODIMENTS

Figure 1:
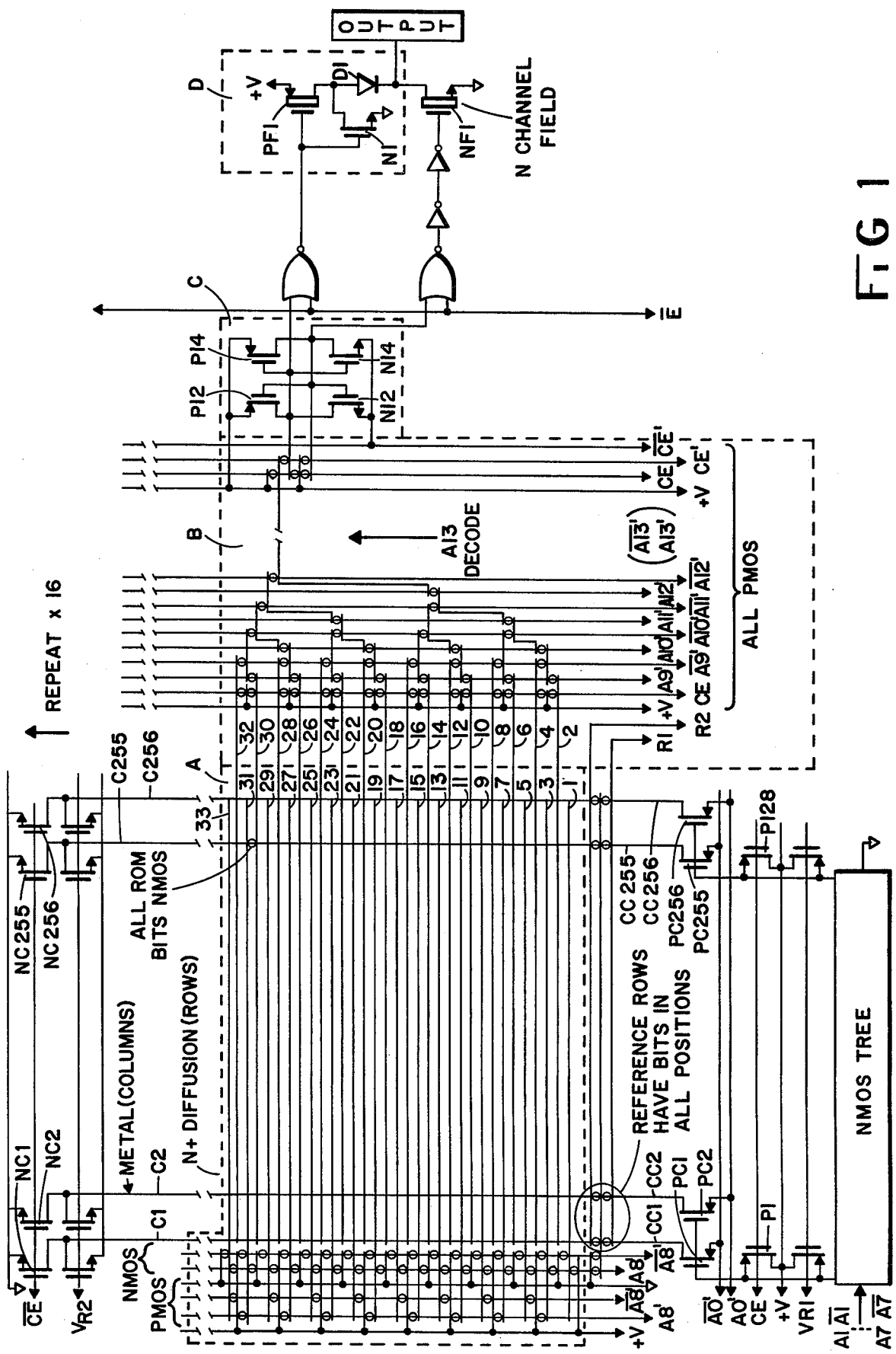
FIG. 1 shows a portion of an MOS integrated circuit memory including memory sub-matrix "A", decoding means "B", sense amplifier "C", and output means "D".

A single preferred embodiment serves to illustrate the present invention.

FIG. 1 illustrates a portion of a CMOS ROM, showing certain portions of the memory matrix, address circuitry, and output circuit. In FIG. 1, the subcircuit "A" (enclosed by the dashed lines) is a memory submatrix and portions of the control circuitry. The memory submatrix comprises 256 individual N-channel MOS transistors in a row between each pair of lines in the X-direction. Each of the 33 lines depicted in subcircuit "A" comprises a continuous N+-doped region which serves simultaneously as either a source or drain, and as a conductive line for transmission of control and readout signals. Orthogonal to the X-lines are 256 columns in the Y-direction, each of which forms gates for 32 NMOS devices comprising the word. Each of the 256 word lines (C1, C2, C255, C256 are depicted) may, for example, comprise a metal conductor strip insulated from the X-lines. Details and alternatives of the submatrix are articulated in the companion application hereinbefore cited.

The even-numbered X-lines (2–32) extend beyond the right of Column 256 to the decoder subcircuit B; these lines form a common drain for both of two adjacent rows of N-channel transistors. The remaining X-lines (1–33) extend beyond the left of Column C1; these remaining lines form a common source for and lie between half of the adjacent rows each having the exemplary 256 N-channel transistors. X-lines 2–32 extending to the right of all the columns comprise shared bit lines and the second series (1–33) of alternate X-lines extending to the left of all the columns comprise voltage-selectable power lines. The columns comprise word lines. As shown by the broken word lines above subcircuit A, the memory matrix may be iterated (here 16 times) to provide the desired memory capacity.

To provide the ROM function, preselected N-channel transistors are provided with a much thinner insulating layer under the word line comprising their gates than the remainder of the N-channel transistors. To exemplify, such a transistor is denoted by a circle under Column C255 and between X-lines 30 and 31. Further details of the construction are given in the copending application hereinbefore cited. The differential insulator thickness under the gates of the transistors provides preselected first and second conductivity levels for the respective N-channel transistors; in this embodiment, the thick insulator devices conduct only a very small leakage current while the thin insulator devices have a much higher channel conductivity. This conductivity differential may then be sensed to provide the output of the memory.

In operation, alternate shared-source lines of the submatrix are held at +V or ground by the columns of complmentary P-channel and N-channel transistors under the pairs of address lines A8′ and $\overline{A8}$′ to the left of Column C1 of subcircuit A. Subcircuit B is an arrangement of P-channel MOS transistor switches for selecting the desired bit line of the memory submatrix in response to the address signals A9′ through A12′.

When it is desired to interrogate a given row of memory submatrix A (e.g. the row lying between X-lines 30 and 31), the shared bit line 30 is precharged to +V by a clock enable signal (CE) impressed on the load devices under the left CE line of subcircuit B. Then, the shared source line 31 is discharged to ground by appropriate application of address signals A8′ and $\overline{A8}$′ to the two columns of NMOS transistors on the left of the subcircuit A. Alternate X-lines (e.g. 29) are held at +V to obviate leakage across the adjacent rows of devices (e.g. those between X-lines 29 and 30).

Each column has first and second extremities (C1-C256 and CC1-CC256 respectively) one on either side of the submatrices and coupled between N-channel transistors NC-1 through NC-256 at the first extremity and P-channel transistors PC1-PC256 in series with P-channel transistors P1-P128 at the second extremity. The column to be interrogated (e.g. C255) is preselected by the $\overline{CE}$ signal to turn on N-channel transistors NC1-NC256 and by the appropriate A1—$\overline{A1}$ through A7—$\overline{A7}$ signal to turn on P-channel transistor P128. Then signal $\overline{A0}$′ turns on P-channel transistor PC255 to control a conductive channel at the exemplary ROM bit under Column C255.

Because the desired bit line has been precharged prior to the application of delayed address signal parts A0′—$\overline{A0}$′ and A9′—$\overline{A9}$′ through A12′—$\overline{A12}$′, spurious signals due to capacitive currents in the desired bit line are obviated and the memory submatrix simulates full static operation due to the quasi-dynamic mode of operation described above.

Further potential spurious signals in the readout means are reduced by the arrangement and operation of the sense amplifier of subcircuit C of FIG. 1. In the preferred embodiment shown, the balanced sense amplifier comprises two pairs of complementary transistors, each pair being serially connected with a common first main (drain) terminal and then with second main terminals (sources) being coupled to separate supply means. Additionally, the control gates of each pair are interconnected. The common main drain terminal of each pair is capacitively coupled to the common control gates of the other pair to allow detection of very small signals. Application of signal CE precharges and equalizes the sense amplifier before it is coupled to the bit line to be interrogated (e.g. 30).

Yet another improved circuit for use with the instant invention is shown by FIG. 1 in subcircuit D. Subcircuit D is an output circuit for the memory submatrix in subcircuit A of FIG. 1. The circuit comprises a P-channel driver PF1 connected between the +V supply means and a diode D1. The connection of the diode D1 between the P-channel output transistor PF1 in the output terminal allows the output driver to be in a high impedance state when the chip is powered down, that is, when the supply voltage +V has been removed and the +V terminal has been shorted to the ground terminal.

The preferred implementation of the output circuit in a CMOS integrated circuit is shown by FIG. 2. Bipolar transistor B1 is a substrate NPN transistor whose collector is the same semiconductor region as the substrate or channel region of the P-channel transistor PF1, thus, the interconnection between the two devices may be at least partially provided by the semiconductor region common to both of them.

FIG. 3 shows the details of an address-buffer circuit with provision for generating a monostable pulse which is coupled via a common bus connected to all of the address-buffer circuits to the clock generator which generates the clock pulses CE—$\overline{CE}$ and the delayed clock pulses CE′—$\overline{CE}$′ which are used to activate all the other circuits.

Cross-coupled complementary transistor pairs P2, N2, and P4, N4 respond to the external input address signal to provide the internal address signals An, $\overline{An}$. The inverted address signal at the gate of N-channel transistor N2 is coupled with amplifier A5 and through inverter A1 to amplifier A3; the outputs from amplifiers A3 and A5 are then combined to apply the monostable pulse to the common bus through N-channel transistor N3. Substantially identical address-buffer circuits for each of the An external address inputs are combined on the common bus.

FIG. 4 includes subcircuit B which is the clock generator driven by the common bus. The FIG. 4 also shows details of generation of the clock pulses CE, $\overline{CE}$ and delayed clock pulses CE', $\overline{CE}'$.

A potential problem with the high density large capacity memory, a portion of which is shown in FIG. 1, is the possibility of experiencing different bit conductivities at different memory locations due to finding the conductivities of the rather long lines in both directions of the array itself as well as the lines which control the peripheral transistors which supply current to the memory devices. The orthogonal lines also have substantial capacitances so that the dynamic response varies according to the bit location. Since the address signals A8', $\overline{A8}'$ for discharging the common source lines (odd lines 1-33) are applied last, the dynamic responses vary during readout. To maximize performance of the memory, it is desirable to have all conductive bits alike, or in the alternative to have a means for compensating for inhomogeneities. In addition, the devices which supply current to the conductive bits will be sensitive to variations, for example, in temperature, which further increases the possibility that spurious bit indications will be obtained. Since it is impractical to design for equality of bit conductance levels throughout the array, the integrated circuit memory of this invention makes provisions for compensation of the word lines and the bit lines. Such compensation is achieved by adding reference rows to the matrix and then providing means for sensing their response. Such rows are shown below the memory submatrix A of FIG. 1. Here, there are an additional two rows of N-channel MOS transistors, each row having a common source which is grounded to the parallel N-channel transistors controlled by signals A8', $\overline{A8}'$. Lines R1 and R2 are common drain lines for each of the two rows of reference devices; the reference rows have bits in all positions as shown in FIG. 1. Selection and activation of the column to be interrogated (e.g. CC255) renders the reference devices in that column conductive. Current is supplied to lines R1 and R2. These reference voltages track the variation in the voltage on the preselected word line (column) as well as differences in the voltage levels caused by the circuitry connected to A8', $\overline{A8}'$ which discharges the shared source lines to ground. The reference voltage generated on line R1 is then used to compensate the sense amplifier, whereby temporal, geometrical and temperature compensation is achieved. The temporal compensation contributes to the quasi-static operating mode for the integrated circuit memory.

Specific circuitry for accomplishing this is shown in FIG. 4, subcircuit A. Here, P-channel devices P8 and P10 supply current to reference lines R1 and R2. Voltage in reference line R1 is coupled through amplifier A2 to generate CE' and through amplifiers A2 and A4 to generate reference signals $\overline{CE}'$. These signals, delayed from the clock enable pulse (CE), are applied to the high-gain sense amplifier as shown in FIG. 1. Reference pulse $\overline{CE}'$ is applied to the sources of N-channel transistors N12 and N14 so that high-gain sense amplifier of subcircuit B is sensitive to the difference between the reference voltage derived from the reference lines and the actual voltage in the bit being interrogated.

A single preferred embodiment of an integrated circuit memory has been utilized to explain the circuits of the present invention. It will be appreciated by those skilled in the art that the circuits described, as well as the methods of operating the integrated circuit memory, have many applications outside the particular combination shown in the preferred embodiment. For example, the method for deriving a compensated reference voltage by use of reference rows in the memory itself has applications in other configuration of integrated memory circuits. Likewise, the method in circuitry for sequencying the operation of the memory in order to achieve a quasi-static mode of operation is applicable to integrated circuit memories having configurations substantially different than that shown by the preferred embodiment. The method of operation and circuitry of the high-gain sense amplifier is likewise applicable to other memory configurations and may have applications in circuits in other than memories as well. Thus, the methods and circuitry contemplated by the foregoing description serve only to illustrate the invention, which is limited solely by the appended claims.

What is claimed is:

1. An integrated circuit memory, comprising:
   rows of devices each of a first polarity and each having one of first and second predetermined conductivity levels;
   shared bit lines for adjacent pairs of said rows of devices;
   a plurality of devices of second polarity complementary to said first polarity, each of said devices coupled to one of said shared bit lines;
   at least two rows of reference devices each having said first predetermined conductivity level;
   word lines for selecting and activating a single device in each of said rows of devices and in each of said at least two rows of reference devices;
   sensing means coupled to one of said rows of devices and responsive to the conductivity level in said device;
   reference means coupled between said sensing means and said at least two rows of reference devices for compensating and equalizing the response of said sensing means;
   clock means coupled to said plurality of devices for charging said shared bit lines before said sensing means is coupled to one of said rows;
   address buffer circuits responsive to address input signals for selecting one of said rows and one of said word lines;
   each of said address buffer circuits having means for forming a pulse in response to its address input signals;
   common bus means for accepting said pulse coupled to each of said address buffer circuits;
   clock generating means coupled to said common bus and responsive to said pulse for generating clock signals; and
   output means coupled to said sensing means, said output means comprising a bipolar transistor and a MOS transistor.

* * * * *